(12) United States Patent
Matsuura et al.

(10) Patent No.: US 6,616,526 B2
(45) Date of Patent: Sep. 9, 2003

(54) CLEAN ROOM AND METHOD FOR FABRICATING SEMICONDUCTOR DEVICE

(75) Inventors: Takahiro Matsuura, Takatsuki (JP); Haruo Nakase, Kusatsu (JP)

(73) Assignee: Matsushita Electric Industrial Co., LTD (JP)

( * ) Notice: Subject to any disclaimer, the term of this patent is extended or adjusted under 35 U.S.C. 154(b) by 0 days.

(21) Appl. No.: 10/003,407

(22) Filed: Dec. 6, 2001

(65) Prior Publication Data

US 2002/0081962 A1 Jun. 27, 2002

(30) Foreign Application Priority Data

Dec. 21, 2000 (JP) ......................................... 2000-388319

(51) Int. Cl.$^7$ ................................................. B01L 1/04
(52) U.S. Cl. ........................................ 454/187; 414/935
(58) Field of Search ................................. 454/187, 228; 414/935; 55/385.2

(56) References Cited

U.S. PATENT DOCUMENTS

| | | | | |
|---|---|---|---|---|
| 4,267,769 A | * | 5/1981 | Davis et al. | 454/187 |
| 4,693,173 A | * | 9/1987 | Saiki et al. | 454/187 |
| 5,058,491 A | * | 10/1991 | Wiemer et al. | 454/187 |
| 5,096,477 A | * | 3/1992 | Shinoda et al. | 55/385.2 |
| 5,316,518 A | * | 5/1994 | Challenger | 454/187 |
| 5,934,992 A | * | 8/1999 | Sohier et al. | 454/190 |

FOREIGN PATENT DOCUMENTS

| | | |
|---|---|---|
| JP | 08-105641 | 4/1996 |
| JP | 08-189681 | 7/1996 |

\* cited by examiner

*Primary Examiner*—Derek Boles
(74) *Attorney, Agent, or Firm*—Nixon Peabody LLP; Thomas W. Cole

(57) ABSTRACT

The clean room of this invention includes a first clean region in which a semiconductor substrate to be set in a fabrication system is disposed and a second clean region adjacent to the first clean region in which an operator is disposed. A first air flow flowing downward is introduced into the first clean region and a second air flow flowing downward is introduced into the second clean region. The rate of the first air flow is higher than the rate of the second air flow.

13 Claims, 9 Drawing Sheets

CLEAN ROOM AND METHOD FOR
FABRICATING SEMICONDUCTOR DEVICE

BACKGROUND OF THE INVENTION

The present invention relates to the structure of a clean room and a method for fabricating a semiconductor device.

When floating particles present in a region of a clean room where semiconductor devices are fabricated by processing semiconductor wafers are adhered onto the semiconductor wafers, the proportion of defectives increases. Therefore, reduction of floating particles is a significant problem in the fabrication of semiconductor devices.

Accordingly, in a clean room, the externally supplied air is introduced through a particle air filter and the introduced air is set to flow downward.

In accordance with size reduction of semiconductor devices on which complicated integrated circuits are built, it is desired, in a clean room, to remove smaller floating particles and to further reduce the number of floating particles.

For this purpose, it is necessary (1) to increase the number of particle air filters provided in a clean room and (2) to employ a higher performance particle air filter capable of removing smaller floating particles.

However, in employing these methods (1) and (2), it is necessary to construct a new clean room or reconstruct a building including a clean room, which requires disadvantageously high cost.

Furthermore, when the number of particle air filters provided in a clean room is increased, the pressure loss of air flow is increased. In order to attain a desired air flow rate with the pressure loss of the air flow increased, it is necessary to use a high performance fan with a large capacity, which disadvantageously increases the operation cost of the clean room.

SUMMARY OF THE INVENTION

In consideration of the aforementioned conventional problems, an object of the invention is improving inter-process yield in semiconductor fabrication by reducing the number of floating particles present in a region where a semiconductor substrate is placed.

The present inventors have examined a method for reducing the number of floating particles with attention given to air flow in a clean room. As a result, it has been found that the rate and direction of the air flow affect the number of floating particles and are in close connection with the inter-process yield.

The present invention was devised on the basis of the findings and is specifically as follows:

The clean room of this invention comprises a first clean region in which a semiconductor substrate to be set in a fabrication system is disposed; and a second clean region adjacent to the first clean region in which an operator is disposed, and a first air flow flowing downward is introduced into the first clean region and a second air flow flowing downward is introduced into the second clean region, and a rate of the first air flow is higher than a rate of the second air flow.

In the clean room of this invention, the rate of the first air flow introduced into the first clean region where the semiconductor substrate is disposed is higher than the rate of the second air flow introduced into the second clean region where the operator is disposed. Therefore, floating particles present in a region where the semiconductor substrate is placed are moved to the vicinity of the floor of the clean room so as to be discharged to the outside of the clean room. As a result, the number of particles adhered onto the surface of the semiconductor substrate can be reduced.

In the clean room, the rate of the first air flow is preferably not less than 1.3 times as high as the rate of the second air flow.

Thus, the number of floating particles present in the region where the semiconductor substrate is placed can be remarkably reduced.

The clean room preferably further comprises partition means disposed between the first clean region and the second clean region for separating the first air flow from the second air flow.

In this manner, the first air flow is minimally affected by the second air flow, so that the rate of the first air flow can be much higher than the rate of the second air flow. Therefore, the number of floating particles present in the region where the semiconductor substrate is placed can be further reduced, resulting in further reducing the number of particles adhered onto the surface of the semiconductor substrate.

In the case where the clean room includes the partition means, an area ratio, to the first clean region, of a first air flow inlet for taking in the first air flow is preferably larger than an area ratio, to the second clean region, of a second air flow inlet for taking in the second air flow.

Thus, even when the power of a fan for supplying the outside air to the first air flow inlet is equal to the power of a fan for supplying the outside air to the second air flow inlet, the rate of the first air flow can be higher than the rate of the second air flow. In other words, without exchanging means for supplying the outside air to the clean room such as a duct or a fan, the rate of the first air flow can be made higher than the rate of the second air flow. Accordingly, the number of floating particles can be reduced without largely reconstructing the clean room.

In the case where the clean room includes the partition means, the partition means preferably has a four-plane structure having an upper opening and a lower opening, and the upper opening has an area larger than the lower opening.

Thus, the first air flow is further minimally affected by the second air flow, so that the rate of the first air flow can be much higher than the rate of the second air flow. Therefore, the number of floating particles present in the region where the semiconductor substrate is placed can be further reduced.

In the case where the clean room includes the partition means, the partition means is preferably disposed with a lower end thereof positioned at a height of 1.2 through 1.8 m above a floor.

Thus, the work efficiency of the operator in dealing with the fabrication system or the semiconductor substrate can be retained without spoiling the effect to reduce the number of floating particles.

In the case where the clean room includes the partition means, the partition means is preferably made from a transparent material.

Thus, the work efficiency of the operator in dealing with the fabrication system or the semiconductor substrate can be retained.

The method for fabricating a semiconductor device of this invention comprises a step of setting a semiconductor substrate in a fabrication system through an operation of an operator in a clean room including a first clean region in which the semiconductor substrate to be set in the fabrication system is disposed and a second clean region adjacent to the first clean region in which the operator is disposed, and a first air flow flowing downward is introduced into the first clean region and a second air flow flowing downward is introduced into the second clean region, and a rate of the first air flow is higher than a rate of the second air flow.

In the method for fabricating a semiconductor device of this invention, since the rate of the first air flow introduced into the first clean region where the semiconductor substrate is disposed is higher than the rate of the second air flow introduced into the second clean region where the operator is disposed, floating particles present in a region where the semiconductor substrate is placed can be moved to the vicinity of the floor of the clean room to be discharged to the outside of the clean room. Therefore, the number of particles adhered onto the surface of the semiconductor substrate can be largely reduced, resulting in improving the inter-process yield of semiconductor devices.

In the method for fabricating a semiconductor device, the rate of the first air flow is preferably not less than 1.3 times as high as the rate of the second air flow.

Thus, the number of floating particles present in the region where the semiconductor substrate is placed can be largely reduced, resulting in largely improving the inter-process yield of semiconductor devices.

DETAILED DESCRIPTION OF THE INVENTION

Embodiment 1

Figure 1A:
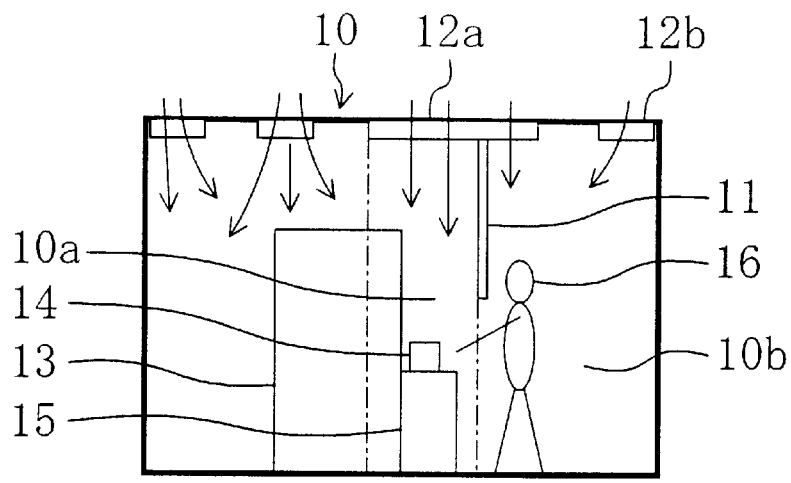
FIGS. 1A, 1B and 1C are a left side view, a front view and a plan view of a clean room according to Embodiment 1 of the invention, respectively.

A clean room and a method for fabricating a semiconductor device according to Embodiment 1 of the invention will now be described with reference to FIGS. 1A, 1B and 1C. FIG. 1A is a left side view of the clean room 10, FIG. 1B is a front view thereof and FIG. 1C is a plan view thereof.

Figure 1B:
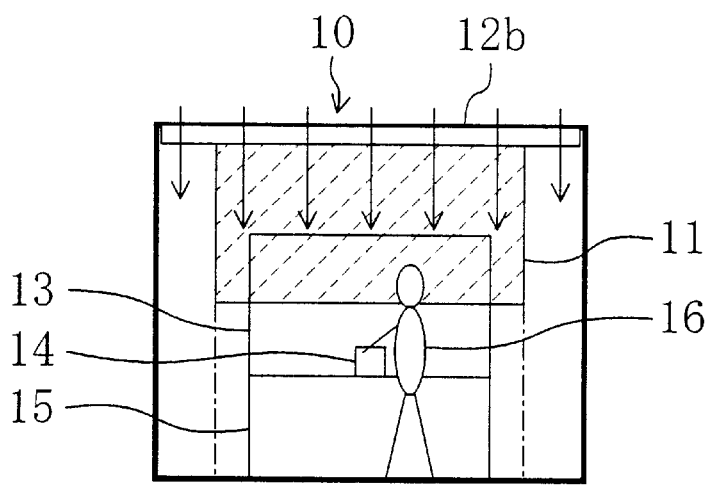
Figure 1C:
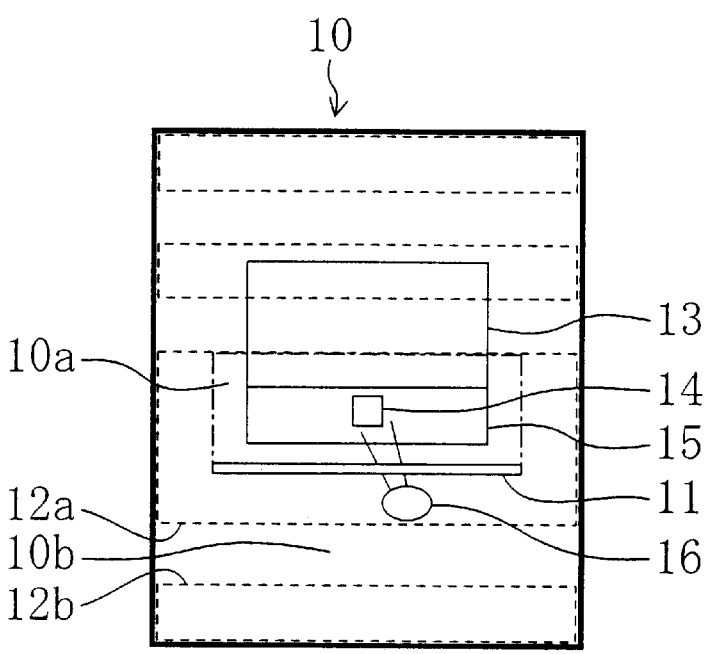

As shown in FIGS. 1A through 1C, the clean room 10 includes a first clean region 10a in which a cassette 14 containing a semiconductor substrate to be set in a semiconductor fabrication system 13 (such as a dry etching system) is disposed and a second clean region 10b outside the first clean region 10a in which a standing or sitting operator 16 works. An eyelid 11 in a plate shape is provided between the first clean region 10a and the second clean region 10b.

In the first clean region 10a, a part of the semiconductor fabrication system 13 and a table 15 connected to the semiconductor fabrication system 13 are disposed, and the cassette 14 containing the semiconductor substrate is placed on the table 15.

The operator 16 working in the second clean region 10b takes out the semiconductor substrate from the cassette 14 to transfer it to the semiconductor fabrication system 13 or sets the cassette 14 containing the semiconductor substrate in the semiconductor fabrication system 13. In the latter case, the semiconductor fabrication system 13 takes the semiconductor substrate contained in the cassette 14 into the semiconductor fabrication system 13.

At this point, the operator 16 transfers the semiconductor substrate from the cassette 14 to the semiconductor fabrication system 13 or sets the cassette 14 in the semiconductor fabrication system 13 with his/her arms thrust into the first clean region 10a from below the eyelid 11.

A first air flow inlet 12a is provided on the ceiling of the first clean region 10a and a second air flow inlet 12b is provided on the ceiling of the second clean region 10b, so that the outside air of the clean room 10 can be introduced into the first clean region 10a through the first air flow inlet 12a and into the second clean region 10b through the second air flow inlet 12b.

In Embodiment 1, a fan for supplying the outside air to the first air flow inlet 12a and a fan for supplying the outside air to the second air flow inlet 12b are of the same type or have the same performance.

Also, the area of the first clean region 10a is smaller than the area of the second clean region 10b, and the area of the first air flow inlet 12a is larger than the area of the second air flow inlet 12b. Therefore, the area ratio of the first air flow inlet 12a to the first clean region 10a is higher than the area ratio of the second air flow inlet 12b to the second clean region 10b.

Figure 2:
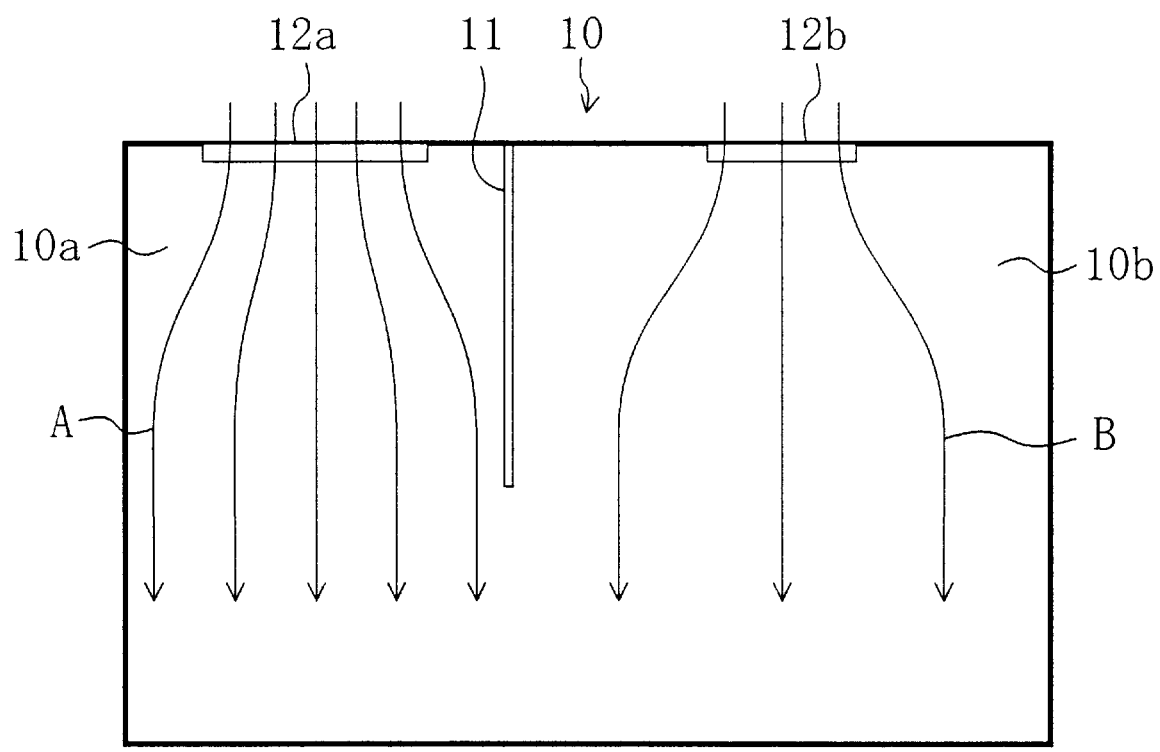
FIG. 2 is a diagram for explaining that the rate of a first air flow is larger than the rate of a second air flow in a clean room according to each embodiment of the invention.

Accordingly, the rate of a first air flow flowing downward in the first clean region 10a is higher than the rate of a second air flow flowing downward in the second clean region 10b. Specifically, although the rate of the air flow from the first air flow inlet 12a is substantially the same as the rate of the air flow from the second air flow inlet 12b, the degree of diffusion of the downward air flow is smaller in the first clean region 10a than in the second clean region 10b as shown in FIG. 2. Therefore, the rate of the first air flow A flowing downward in the first clean region 10a is higher than the rate of the second air flow B flowing downward in the second clean region 10b.

The areas of the openings of the first air flow inlet 12a and the second air flow inlet 12b are not particularly specified as far as the area ratio of the first air flow inlet 12a to the first clean region 10a is higher than the area ratio of the second air flow inlet 12b to the second clean region 10b. When the areas of the openings of the first and second air flow inlets 12a and 12b are small, it is advantageous in cost because the number of particle air filters provided to the first and second air flow inlets 12a and 12b can be reduced and the capacities of the fans for introducing the outside air can be lowered. On the other hand, when the areas of the openings of the first and second air flow inlets 12a and 12b are large, the performance to remove floating particles contained in the air introduced into the clean room 10 can be advantageously improved.

Since the eyelid 11 serving as partition means for separating the first air flow from the second air flow is provided between the first clean region 10a and the second clean region 10b in Embodiment 1, both of the first and second air flows flow from the ceiling to the floor in a substantially vertical direction. Therefore, the first air flow is minimally affected by the second air flow, so that the state where the rate of the first air flow is higher than the rate of the second air flow can be facilitated.

Accordingly, in the vicinity of a region where the cassette 14 is placed in the first clean region 10a, the first air flow flows from the ceiling to the floor in the substantially vertical direction at a rate higher than the second air flow, and hence, floating particles present in the vicinity of the region where the cassette 14 is placed are rapidly moved to the vicinity of the floor of the clean room 10 to be discharged to the outside of the clean room 10. Accordingly, the number of particles adhered onto the surface of the semiconductor substrate contained in the cassette 14 to be taken in the semiconductor fabrication system 13 can be largely reduced, resulting in improving the inter-process yield of semiconductor devices.

The shape, the material and the structure of the eyelid 11 are not particularly specified as far as it has a function to separate the first air flow from the second air flow, and the eyelid 11 is preferably made from a transparent and rigid material such as an acrylic resin plate. When the eyelid 11 is transparent, the operator 16 can visually recognize the semiconductor fabrication system 13 and the cassette 14 during the operation, and hence, the work efficiency can be improved. Also, when the eyelid 11 is made from a rigid material, the eyelid 11 is minimally flapped even when the rate of the first air flow of the first clean region 10a is increased.

Furthermore, the eyelid 11 is preferably provided with antistatic means and is preferably made from a material in which time required for attenuating charge from 5 kv to 0 kv is 1 second or less. In this manner, adhesion of particles onto the eyelid 11 derived from the fast air flow can be avoided, so as to suppress the lowering of the inter-process yield accompanying dropping of particles.

Moreover, the eyelid 11 is preferably provided with means for preventing organic material contamination and is preferably made from a material having an outgas amount per gram of 1 ng or less at room temperature. In this manner, pattern failure or leakage failure of semiconductor devices can be prevented from being caused through diffusion of an organic material generated from the eyelid 11 in the clean room 10.

Also, the eyelid 11 is preferably disposed with the lower end thereof positioned at a height of 1.2 through 1.8 m above the floor for the following reason: When the lower end of the eyelid 11 is positioned at a height exceeding 1.8 m above the floor, the first air flow is easily affected by the second air flow, and hence, the effect to reduce the number of floating particles can be degraded, so that the inter-process yield cannot be sufficiently improved. On the other hand, when the lower end of the eyelid 11 is positioned at a height smaller than 1.2 m above the floor, the arms of the operator 16 can easily touch the lower end of the eyelid 11, and the touch may generate particles so that the inter-process yield cannot be sufficiently improved and the work efficiency of the operator 16 can be degraded. In contrast, when the lower end of the eyelid 11 is positioned at a height of 1.2 through 1.8 m above the floor, the effect to reduce the number of floating particles is not spoiled, and the work efficiency of the operator 16 with a standard height (of 1.5 through 2.0 m) standing or sitting on a chair is substantially the same as that attained without providing the eyelid 11.

Furthermore, the eyelid 11 may be fixed on the ceiling of the clean room 10 with an adhesive or the like but is preferably suspended from the ceiling with a hook or the like. When the eyelid 11 is thus suspended, it can be easily removed or exchanged. Therefore, the eyelid 11 can be easily temporally removed in exchanging the semiconductor fabrication system 13.

Figure 3:
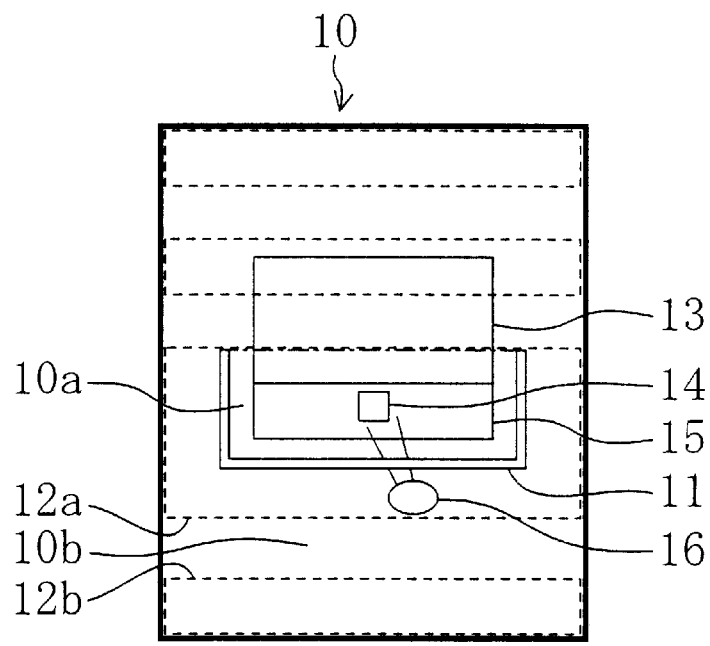
FIG. 3 is a plan view of a clean room according to a first modification of Embodiment 1.

FIG. 3 is a plan view of the clean room 10 according to a first modification of Embodiment 1, which corresponds to FIG. 1C. In the first modification, the eyelid 11 has a three-plane structure having three surfaces positioned between the first clean region 10a and the second clean region 10b, namely, one surface positioned between the operator 16 and the table 15 and two surfaces positioned on the outside of the edges of the table 15.

When the eyelid 11 has such a three-plane structure, the first air flow introduced into the first clean region 10a and flowing downward is more minimally affected by the second air flow introduced into the second clean region 10b and flowing downward. As a result, the state where the rate of the first air flow is higher than the rate of the second air flow can be further facilitated.

Figure 4:
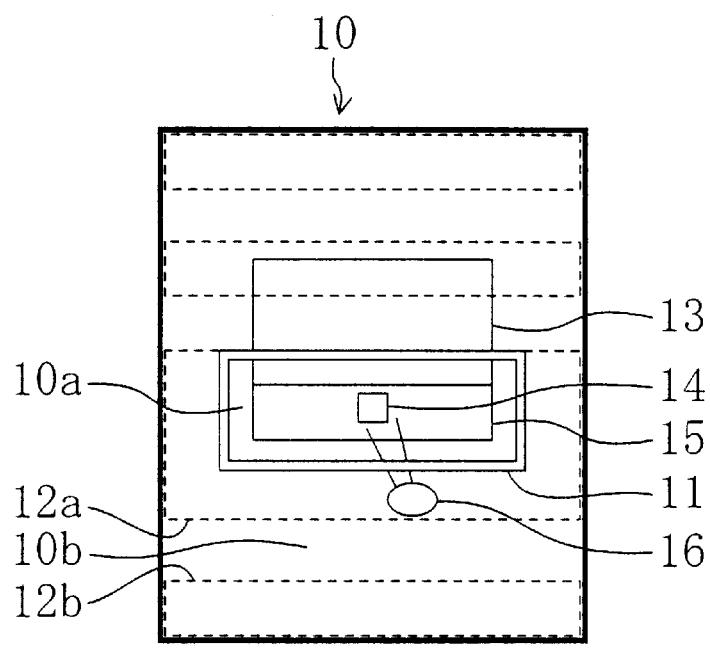
FIG. 4 is a plan view of a clean room according to a second modification of Embodiment 1.

FIG. 4 is a plan view of the clean room 10 according to a second modification of Embodiment 1, which corresponds to FIG. 1C. In the second modification, the eyelid 11 has a four-plane structure (namely, a frame structure) having four surfaces positioned between the first clean region 10a and the second clean region 10b.

When the eyelid 11 has such a four-plane structure, the first air flow introduced into the first clean region 10a and flowing downward is more minimally affected by the second air flow introduced into the second clean region 10b and flowing downward. As a result, the state where the rate of the first air flow is higher than the rate of the second air flow can be further facilitated.

Figure 5:
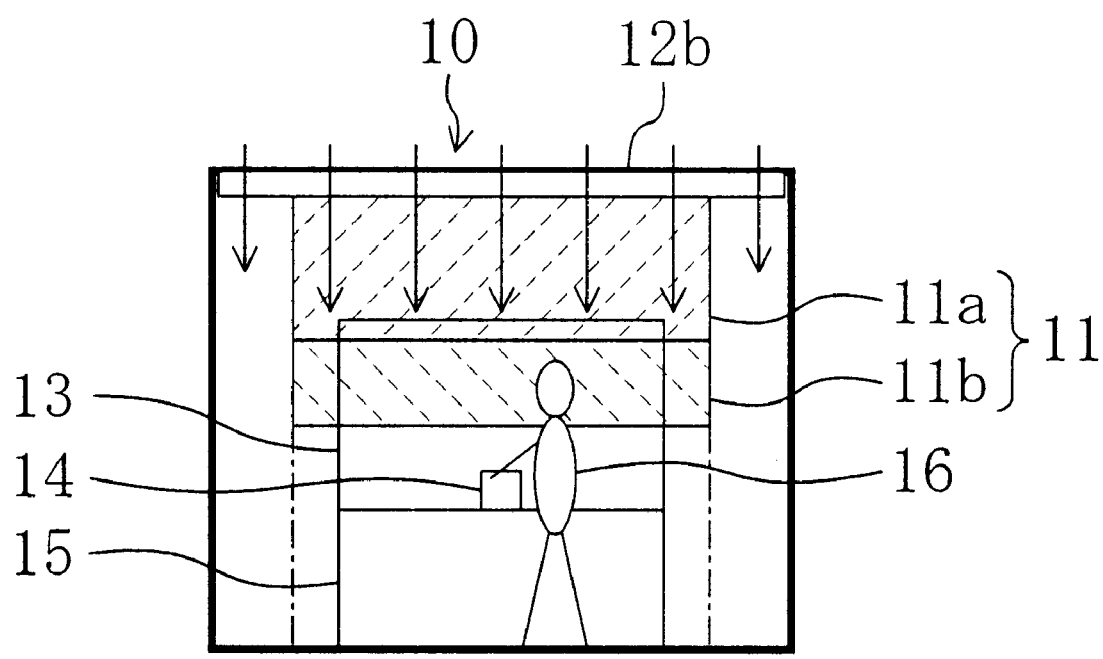
FIG. 5 is a front view of a clean room according to a third modification of Embodiment 1.

FIG. 5 is a front view of the clean room 10 according to a third modification of Embodiment 1, which corresponds to FIG. 1B. In the third modification, the eyelid 11 includes a transparent rigid material 11a (such as an acrylic resin plate) in an upper portion thereof and a transparent soft material 11b (such as a vinyl sheet) in a lower portion thereof.

When such an eyelid 11 is used, the first air flow can be prevented from being affected by the second air flow by the upper rigid material 11a. Also, even when the operator 16 touches the eyelid 11, the operation 16 is prevented from being injured and the eyelid 11 is prevented from being damaged owing to the lower soft material 11b. Moreover, since a soft material is generally lighter than a rigid material, the installation and removal of the eyelid 11 can be eased.

In Embodiment 1 and the first through third modifications thereof, since the fan for supplying the outside air to the first air flow inlet 12a and the fan for supplying the outside air to the second air flow inlet 12b are of the same type or have the same performance, the area ratio of the first air flow inlet 12a to the first clean region 10a is made higher than the area ratio of the second air flow inlet 12b to the second clean region 10b. Instead, the power of the fan for supplying the outside air to the first air flow inlet 12a may be made larger than the power of the fan for supplying the outside air to the second air flow inlet 12b.

Embodiment 2

A clean room and a method for fabricating a semiconductor device according to Embodiment 2 of the invention will now be described with reference to FIGS. 6A and 6B.

Figure 6A:
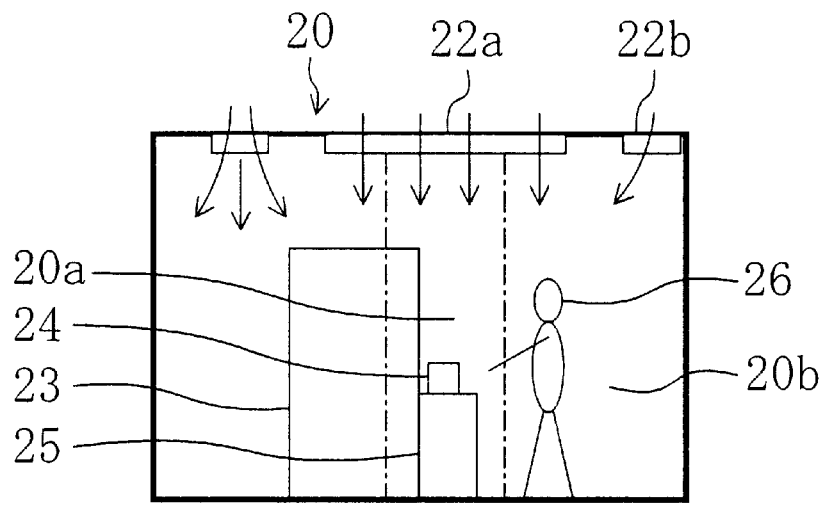
FIGS. 6A and 6B are a left side view and a front view of a clean room according to Embodiment 2 of the invention, respectively.
Figure 6B:
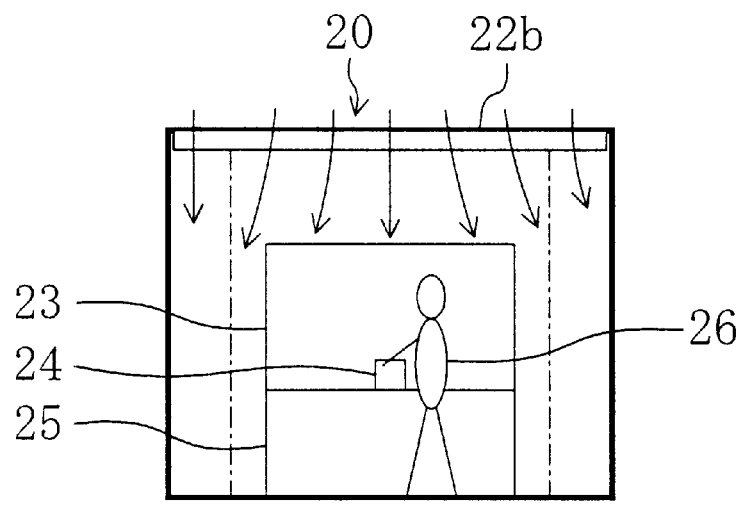

FIG. 6A is a left side view of the clean room 20 and FIG. 6B is a front view thereof.

Embodiment 2 is basically the same as Embodiment 1 except that the eyelid 11 provided in Embodiment 1 is not provided in Embodiment 2.

As shown in FIGS. 6A and 6B, the clean room 20 includes a first clean region 20a in which a cassette 24 containing a semiconductor substrate to be set in a semiconductor fabrication system 23 is disposed and a second clean region 20b outside the first clean region 20a in which an operator 26 works.

In the first clean region 20a, a part of the semiconductor fabrication system 23 and a table 25 connected to the semiconductor fabrication system 23 are disposed, and the cassette 24 containing the semiconductor substrate is placed on the table 25.

A first air flow inlet 22a is provided on the ceiling of the first clean region 20a and a second air flow inlet 22b is provided on the ceiling of the second clean region 20b, so that the outside air of the clean room 20 can be introduced into the first clean region 20a through the first air flow inlet 22a and into the second clean region 20b through the second air flow inlet 22b.

Also in Embodiment 2, a fan for supplying the outside air to the first air flow inlet 22a and a fan for supplying the outside air to the second air flow inlet 22b are of the same type or have the same performance.

Furthermore, the area of the first clean region 20a is smaller than the area of the second clean region 20b, and the area of the first air flow inlet 22a is larger than the area of the second air flow inlet 22b. Accordingly, the area ratio of the first air flow inlet 22a to the first clean region 20a is higher than the area ratio of the second air flow inlet 22b to the second clean region 20b.

As a result, the rate of a first air flow flowing downward in the first clean region 20a is higher than the rate of a second air flow flowing downward in the second clean region 20b.

Embodiment 3

A clean room and a method for fabricating a semiconductor device according to Embodiment 3 of the invention will now be described with reference to FIGS. 7A through 7C.

Figure 7A:
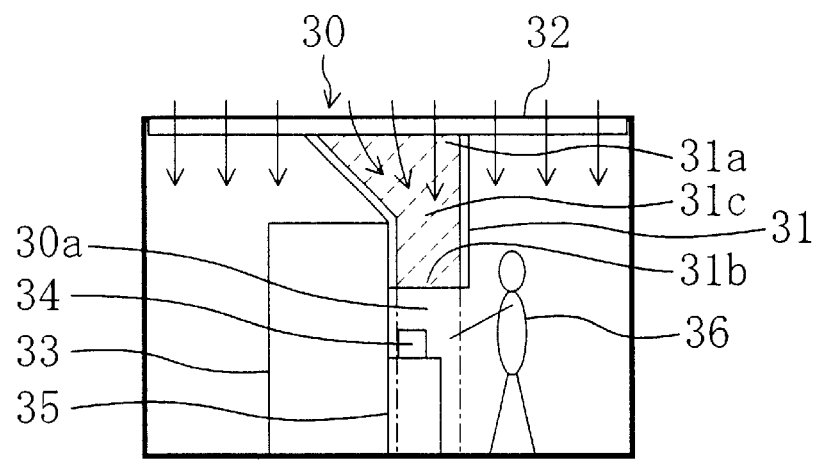
FIGS. 7A, 7B and 7C are a left side view, a front view and a plan view of a clean room according to Embodiment 3 of the invention, respectively.
Figure 7B:
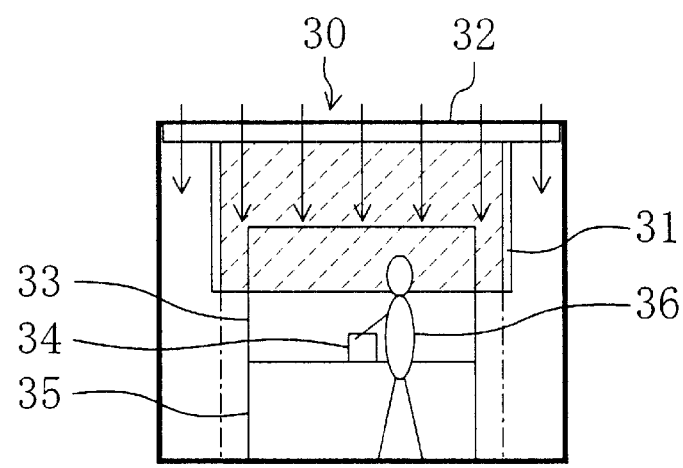
Figure 7C:
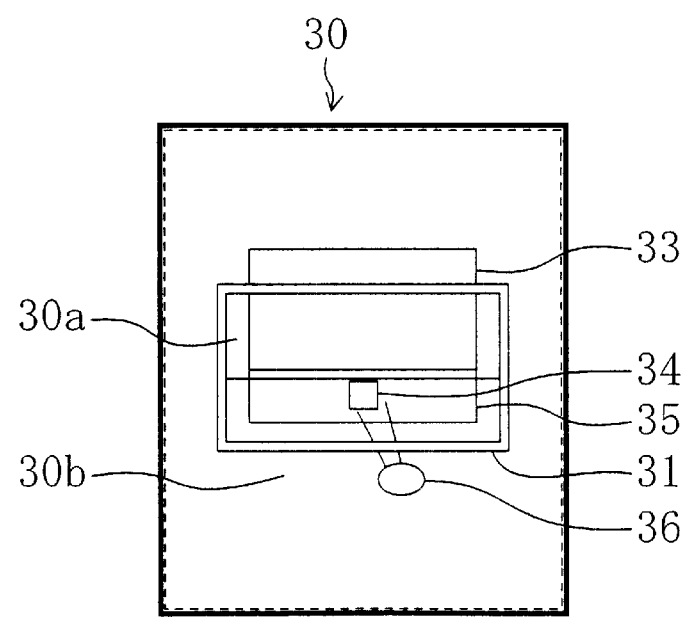

FIG. 7A is a left side view of the clean room 30, FIG. 7B is a front view thereof and FIG. 7C is a plan view thereof.

Embodiment 3 is basically the same as Embodiment 1 except that an eyelid 31 has a different structure from the eyelid 11 of Embodiment 1.

As shown in FIGS. 7A through 7C, the clean room 30 includes a first clean region 30a in which a cassette 34 containing a semiconductor substrate to be set in a semiconductor fabrication system 33 is disposed and a second clean region 30b outside the first clean region 30a in which an operator 36 works.

In the first clean region 30a, a part of the semiconductor fabrication system 33 and a table 35 connected to the semiconductor fabrication system 33 are disposed, and the cassette 34 containing the semiconductor substrate is placed on the table 35.

As a characteristic of Embodiment 3, an air flow inlet 32 is commonly provided on the ceilings of the first clean region 30a and the second clean region 30b, so that the outside air of the clean room 30 can be introduced into the first clean region 30a and the second clean region 30b through the air flow inlet 32.

The eyelid 31 for separating a first air flow introduced into the first clean region 30a from a second air flow introduced into the second clean region 30b has a four-plane structure (frame structure) including an upper opening 31a with a larger area than a lower opening 31b. The opening area is gradually reduced from the upper opening 31a to an intermediate portion 31c and is constant from the intermediate portion 31c to the lower opening 31b. The opening area of the lower opening 31b of the eyelid 31 accords with the area of the first clean region 30a, and the opening area of the upper opening 31a of the eyelid 31 extends over the entire first clean region 30a and part of the second clean region 30b.

Therefore, the first air flow supplied from the air flow inlet 32 to the upper opening 31a of the eyelid 31 is gradually converged from the upper opening 31a to the intermediate portion 31c and thereafter flows as it is from the intermediate portion 31c to the lower opening 31b, so as to be discharged to the first clean region 30a through the lower opening 31b.

On the other hand, since the opening area of the eyelid 31 is gradually reduced downward, the second air flow supplied from the air flow inlet 32 to the second clean region 30b is gradually dispersed.

Therefore, the rate of the first air flow flowing downward in the first clean region 30a is higher than the rate of the second air flow flowing downward in the second clean region 30b.

Accordingly, in the vicinity of a region where the cassette 34 is placed in the first clean region 30a, the first air flow flows from the ceiling to the floor in a substantially vertical direction at a rate higher than the second air flow, and hence, floating particles present in the vicinity of the region where the cassette 34 is placed are rapidly moved to the vicinity of the floor of the clean room 30 to be discharged to the outside of the clean room 30. Accordingly, the number of particles adhered onto the surface of the semiconductor substrate contained in the cassette 34 to be taken in the semiconductor fabrication system 33 can be largely reduced, resulting in improving the inter-process yield of semiconductor devices.

As in Embodiment 1, the shape, the material and the structure of the eyelid 31 are not particularly specified as far as it can separate the first air flow from the second air flow, and the eyelid 31 is preferably made from a transparent and rigid material such as an acrylic resin plate. The reason is the same as that described in Embodiment 1.

Furthermore, the eyelid 31 is preferably provided with antistatic means and is preferably made from a material in which time required for attenuating charge from 5 kv to 0 kv is 1 second or less. The reason is the same as that described in Embodiment 1.

Moreover, the eyelid 31 is preferably provided with means for preventing organic material contamination and is preferably made from a material having an outgas amount per gram of 1 ng or less at room temperature. The reason is the same as that described in Embodiment 1.

In addition, the eyelid 31 is preferably disposed with the lower end thereof positioned at a height of 1.2 through 1.8 m above the floor. The reason is the same as that described in Embodiment 1.

Embodiment 4

A clean room and a method for fabricating a semiconductor device according to Embodiment 4 of the invention will now be described with reference to FIGS. 8A through 8C.

Figure 8A:
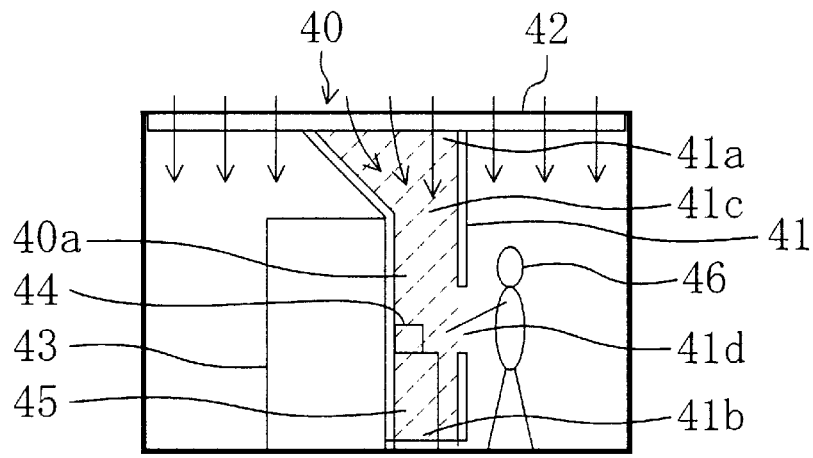
FIGS. 8A, 8B and 8C are a left side view, a front view and a plan view of a clean room according to Embodiment 4 of the invention, respectively.
Figure 8B:
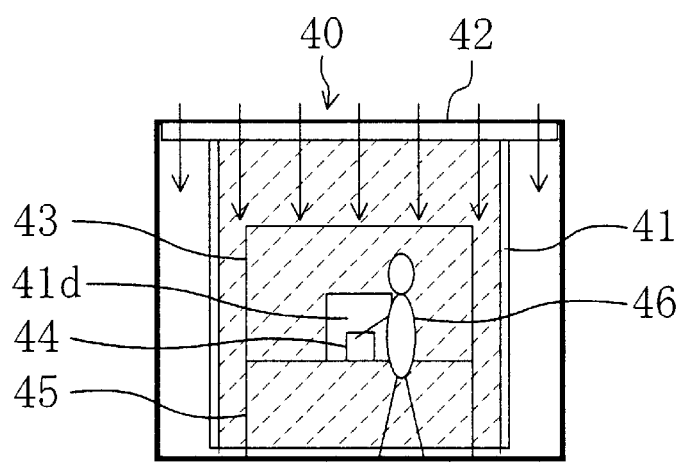
Figure 8C:
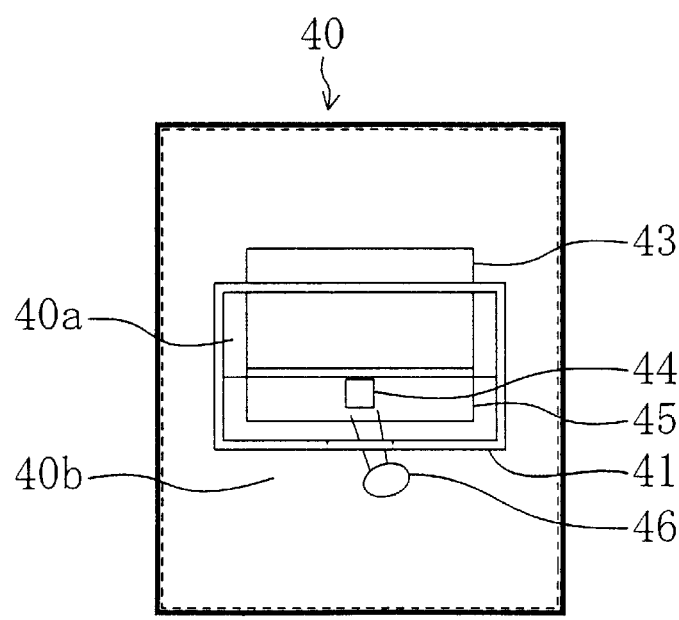

FIG. 8A is a left side view of the clean room 40, FIG. 8B is a front view thereof and FIG. 8C is a plan view thereof.

Embodiment 4 is basically the same as Embodiment 3 except that an eyelid 41 has a different structure from the eyelid 31 of Embodiment 3.

As shown in FIGS. 8A through 8C, the clean room 40 includes a first clean region 40a in which a cassette 44 containing a semiconductor substrate to be set in a semiconductor fabrication system 43 is disposed and a second clean region 40b outside the first clean region 40a in which an operator 46 works.

In the first clean region 40a, a part of the semiconductor fabrication system 43 and a table 45 connected to the semiconductor fabrication system 43 are disposed, and the cassette 44 containing the semiconductor substrate is placed on the table 45.

Also in Embodiment 4, in the same manner as in Embodiment 3, an air flow inlet 42 is commonly provided on the ceilings of the first clean region 40a and the second clean region 40b, so that the outside air of the clean room 40 can be introduced into the first clean region 40a and the second clean region 40b through the air flow inlet 42.

The eyelid 41 for separating a first air flow introduced into the first clean region 40a from a second air flow introduced into the second clean region 40b has a four-plane structure (frame structure) including an upper opening 41a with a larger area than a lower opening 41b. The opening area is gradually reduced from the upper opening 41a to an intermediate portion 41c and is constant from the intermediate portion 41c to the lower opening 41b.

The opening area of the lower opening 41b of the eyelid 41 accords with the area of the first clean region 40a, and the opening area of the upper opening 41a of the eyelid 41 extends over the entire first clean region 40a and part of the second clean region 40b in the same manner as in Embodiment 3.

As a characteristic of Embodiment 4, the lower opening 41b of the eyelid 41 is positioned in the vicinity of the floor of the clean room 40 (at a height of approximately 0.2 m above the floor), and the eyelid 41 is provided with a side opening 41d on its surface facing the operator 46 in the vicinity of the cassette 44.

Therefore, the operator 46 can transfer the semiconductor substrate from the cassette 44 to the semiconductor fabrication system 43 or set the cassette 44 in the semiconductor fabrication system 43 with his/her arms thrust into the first clean region 40a through the side opening 41d.

The first air flow supplied from the air flow inlet 42 to the upper opening 41a of the eyelid 41 is gradually converged from the upper opening 41a to the intermediate portion 41c and thereafter flows as it is from the intermediate portion 41c to the lower opening 41b disposed in the vicinity of the floor.

Therefore, the rate of the first air flow flowing downward in the first clean region 40a is higher than the rate of the second air flow flowing downward in the second clean region 40b. In addition, since the lower opening 41b is positioned lower in Embodiment 4 than in Embodiment 3, the first air flow is more minimally affected by the second air flow, so that the rate of the first air flow can be further increased.

Accordingly, in the vicinity of a region where the cassette 44 is placed in the first clean region 40a, the first flow flows from the ceiling to the floor in substantially a vertical direction at a rate much higher than the second air flow, and hence, floating particles present in the vicinity of the region where the cassette 44 is placed are rapidly moved to the vicinity of the floor of the clean room 40 so as to be discharged to the outside of the clean room 40. Accordingly, the number of particles adhered onto the surface of the semiconductor substrate contained in the cassette 44 to be taken in the semiconductor fabrication system 43 can be largely reduced, resulting in further improving the inter-process yield of semiconductor devices.

As in Embodiment 1, the shape, the material and the structure of the eyelid 41 are not particularly specified as far as it can separate the first air flow from the second air flow, and the eyelid 41 is preferably made from a transparent and rigid material such as an acrylic resin plate. The reason is the same as that described in Embodiment 1.

Furthermore, the eyelid 41 is preferably provided with antistatic means and is preferably made from a material in which time required for attenuating charge from 5 kv to 0 kv is 1 second or less. The reason is the same as that described in Embodiment 1.

Moreover, the eyelid 41 is preferably provided with means for preventing organic material contamination and is preferably made from a material having an outgas amount per gram of 1 ng or less at room temperature. The reason is the same as that described in Embodiment 1.

Now, results of an experiment carried out for evaluating the clean rooms and the methods for fabricating a semiconductor device of Embodiments 1 through 4 will be described. Beforehand, the structure of a clean room 50 of a comparative example will be described with reference to FIGS. 9A and 9B.

Figure 9A:
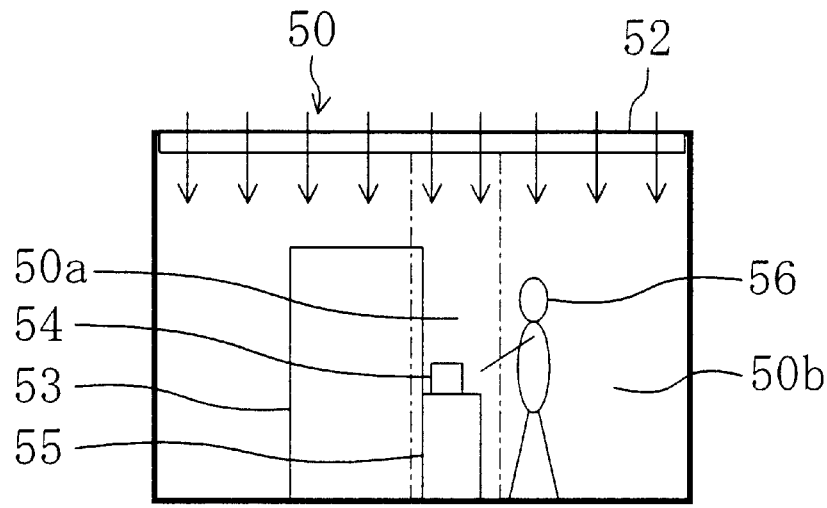
FIGS. 9A and 9B are a left side view and a front view of a clean room according to a comparative example, respectively.
Figure 9B:
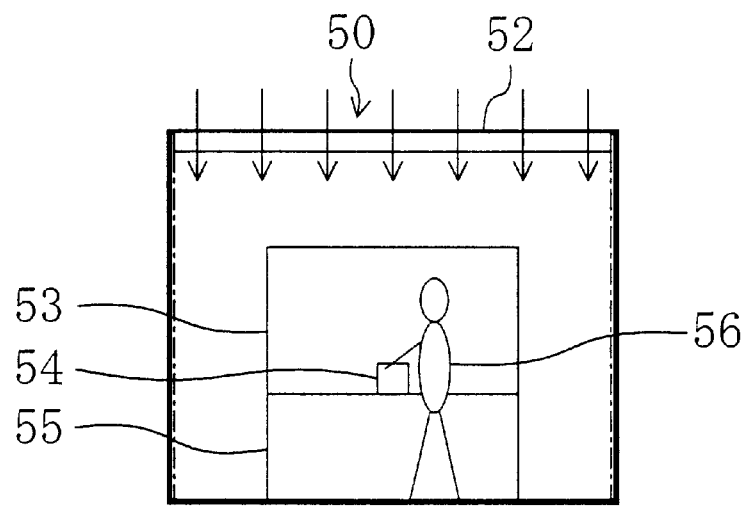

FIG. 9A is a left side view of the clean room 50 and FIG. 9B is a front view thereof.

As shown in FIGS. 9A and 9B, the clean room 50 includes a first clean region 50a in which a cassette 54 containing a semiconductor substrate to be set in a semiconductor fabrication system 53 is disposed and a second clean region 50b outside the first clean region 50a in which an operator 56 works.

In the first clean region 50a, a part of the semiconductor fabrication system 53 and a table 55 connected to the semiconductor fabrication system 53 are disposed, and the cassette 54 containing the semiconductor substrate is placed on the table 55.

An air flow inlet 52 is commonly provided on the ceilings of the first clean region 50a and the second clean region 50b, so that the outside air of the clean room 50 can be introduced into the first clean region 50a and the second clean region 50b through the air flow inlet 52.

In this comparative example, no eyelid is provided. Therefore, the rate of a first air flow flowing downward in the first clean region 50a is the same as the rate of a second air flow flowing downward in the second clean region 50b.

In the comparative example, the rate of the first and second air flows is 0.28 m/s. and the number of floating is particles with a size of 0.7 $\mu$m or more present in the first clean region 50a and the second clean region 50b is $15/28.3$ L (liter).

When semiconductor devices are fabricated in the clean room 50 of the comparative example so as to evaluate the inter-process yield, the proportion of nondefectives is 60.0%.

In the clean room 10 of Embodiment 1, the rate of the first air flow is 0.36 m/s. and the number of floating particles with a size of 0.07 $\mu$m or more is $2/28.3$ L in the first clean region 10a, and the rate of the second air flow is 0.28 m/s. and the number of floating particles with a size of 0.07 $\mu$m or more is $15/28.3$ L in the second clean region 10b. In Embodiment 1, the rate of the first air flow is approximately 1.3 times as high as the rate of the second air flow.

When semiconductor devices are fabricated in the clean room of Embodiment 1 to evaluate the inter-process yield, the proportion of nondefectives is as high as 99.7%.

In the clean room 20 of Embodiment 2, the rate of the first air flow is 0.31 m/s. and the number of floating particles with a size of 0.07 µgm or more is 14/28.3 L in the first clean region 20a, and the rate of the second air flow is 0.28 m/s. and the number of floating particles with a size of 0.07 µm or more is 15/28.3 L in the second clean region 20b. In Embodiment 2, the rate of the first air flow is approximately 1.1 times as high as the rate of the second air flow.

When semiconductor devices are fabricated in the clean room of Embodiment 2 to evaluate the inter-process yield, the proportion of nondefectives is 65.0%, which is higher than that attained by the comparative example.

In the clean room 30 of Embodiment 3, the rate of the first air flow is 0.65 m/s. and the number of floating particles with a size of 0.07 µm or more is 0/28.3 L in the first clean region 30a, and the rate of the second air flow is 0.28 m/s. and the number of floating particles with a size of 0.07 µm or more is 15/28.3 L in the second clean region 30b. In Embodiment 3, the rate of the first air flow is approximately 2.3 times as high as the rate of the second air flow.

When semiconductor devices are fabricated in the clean room of Embodiment 3 to evaluate the inter-process yield, the proportion of nondefectives is as high as 99.9%.

In the clean room 40 of Embodiment 4, the rate of the first air flow is 0.68 m/s. and the number of floating particles with a size of 0.07 µm or more is 0/28.3 L in the first clean region 40a, and the rate of the second air flow is 0.28 m/s. and the number of floating particles with a size of 0.07 µm or more is 15/28.3 L in the second clean region 40b. In Embodiment 4, the rate of the first air flow is approximately 2.4 times as high as the rate of the second air flow.

When semiconductor devices are fabricated in the clean room of Embodiment 4 to evaluate the inter-process yield, the proportion of nondefectives is as high as 99.9%.

Figure 10:
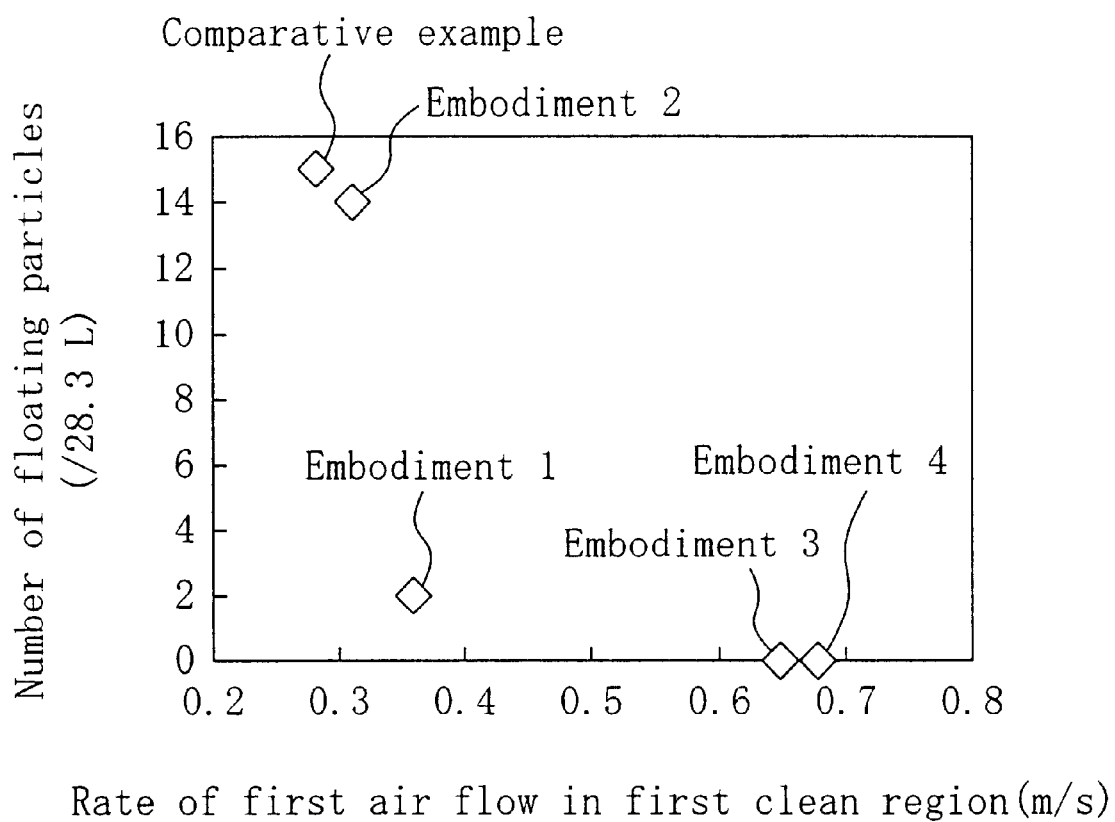
FIG. 10 is a diagram for showing results of an experiment carried out for evaluating the clean rooms and methods for fabricating a semiconductor device of Embodiments 1 through 4.

FIG. 10 is a diagram obtained by plotting the rates of the first air flows and the numbers of floating particles attained in the first clean regions of the clean rooms of Embodiment 1 through 4 and the comparative example.

As is obvious from FIG. 10, the number of floating particles is remarkably reduced in Embodiments 1, 3 and 4, as compared with that in the comparative example.

Furthermore, as is understood from comparison between Embodiment 1 (where the rate of the first air flow/the rate of the second air flow is approximately 1.3) and Embodiment 2 (where the rate of the first air flow/the rate of the second air flow is approximately 1.1), the number of floating particles can be remarkably reduced when the rate of the first air flow is not less than approximately 1.3 times as high as the rate of the second air flow. Accordingly, it is very effective for reducing the number of floating particles to set the rate of the first air flow not less than 1.3 times as high as the rate of the second air flow.

What is claimed is:

1. A clean room comprising:
   a first clean region in which a semiconductor substrate or a cassette to be set in a fabrication system is disposed, and in which a first air flow flowing downward is introduced;
   a second clean region adjacent to said first clean region, and in which an operator is disposed and a second air flow flowing downward is introduced; and
   partition means disposed between said first clean region and said second clean region for separating said first air flow from said second air flow,
   wherein a rate of said first air flow is higher than a rate of said second air flow.

2. The clean room of claim 1,
   wherein the rate of said first air flow is not less than 1.3 times as high as the rate of said second air flow.

3. The clean room of claim 1,
   wherein an area ratio, to said first clean region, of a first air flow inlet for taking in said first air flow is larger than an area ratio, to said second clean region, of a second air flow inlet for taking in said second air flow.

4. The clean room of claim 1,
   wherein said partition means has a four-plane structure having an upper opening and a lower opening, and
   said upper opening has an area larger than said lower opening.

5. The clean room of claim 1,
   wherein said partition means is disposed with a lower end thereof positioned at a height of 1.2 through 1.8 m above a floor.

6. The clean room of claim 1,
   wherein said partition means is made from a transparent material.

7. A method for fabricating a semiconductor device comprising a step of setting a semiconductor substrate in a fabrication system through an operation of an operator in a clean room including a first clean region in which the semiconductor substrate or a cassette to be set in the fabrication system is disposed and in which a first air flow flowing downward is introduced, a second clean region adjacent to said first clean region, and in which an operator is disposed and a second air flow flowing downward is introduced, and partition means disposed between said first clean region and said second clean region for separating said first air flow from said second air flow,
   wherein a rate of said first air flow is higher than a rate of said second air flow.

8. The method for fabricating a semiconductor device of claim 2,
   wherein the rate of said first air flow is not less than 1.3 times as high as the rate of said second air flow.

9. The method for fabricating a semiconductor of claim 7,
   wherein an area ratio of a first air flow inlet, through which said first air flow is introduced, to said first clean region is higher than an area ratio of a second air flow inlet, through which said first air flow is introduced, to said second clean region.

10. The method for fabricating a semiconductor of claim 7,
    wherein said partition means has a four-plane structure having an upper opening and a lower opening, said upper opening has an area larger than said lower opening.

11. The method for fabricating a semiconductor of claim 7,
    wherein a lower end of said partition means is provided at a height of 1.2 through 1.8 m above the floor.

12. The method for fabricating a semiconductor of claim 7,
    wherein said partition means is composed of a transparent material.

13. A clean room comprising:
    a first clean region in which a semiconductor substrate or a cassette to be set in a fabrication system is disposed, and in which a first air flow flowing downward is introduced;
    a second clean region adjacent to said first clean region, and in which an operator is disposed and a second air flow flowing downward is introduced;

partition means disposed between said first clean region and said second clean region for separating said first air flow from said second air flow, wherein said partition means has a four-plane structure having an upper opening and a lower opening, said upper opening has an area larger than said lower opening, and a rate of said first air flow is higher than a rate of said second air flow.

* * * * *